United States Patent
Takahashi

(10) Patent No.: US 6,636,078 B2
(45) Date of Patent: Oct. 21, 2003

(54) SEMICONDUCTOR DEVICE HAVING A REDUCED LEAKAGE CURRENT

(75) Inventor: Hiroyuki Takahashi, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/971,158

(22) Filed: Oct. 4, 2001

(65) Prior Publication Data

US 2002/0040987 A1 Apr. 11, 2002

(30) Foreign Application Priority Data

Oct. 5, 2000 (JP) ........................................ 2000-306710

(51) Int. Cl.[7] ........................ H03K 17/16; H03K 19/20; H03K 19/094
(52) U.S. Cl. ........................ 326/121; 326/112; 326/119; 326/34
(58) Field of Search .................. 326/83, 95, 105, 326/108, 112, 119, 121, 34

(56) References Cited

U.S. PATENT DOCUMENTS 5,408,144 A * 4/1995 Sakata et al. .................. 326/21
5,629,638 A * 5/1997 Kumar ........................ 326/121
6,043,684 A * 3/2000 Landry ........................ 326/98
6,069,497 A * 5/2000 Blongren et al. ............ 326/105

FOREIGN PATENT DOCUMENTS

JP 09-321277 12/1997
JP 2000-82808 3/2000

* cited by examiner

Primary Examiner—Daniel Chang
(74) Attorney, Agent, or Firm—Darryl G. Walker; Bradley T. Sako

(57) ABSTRACT

A semiconductor device including a plurality of logic circuits (G1 to G4) and an insulated gate field effect transistor (IGFET) (N2). The IGFET (N2) may have a current path connected between each of the logic circuits (G1 to G4) and a first reference supply node (VSS). Each logic circuit (G1 to G4) may have a logic output node (Q) that may be at a potential different than the first reference supply when IGFET (N2) is turned off. The IGFET (N2) may have a counter measure to reduce leakage caused by short channel effects when the IGFET is turned off. In this way, leakage current may be reduced.

13 Claims, 6 Drawing Sheets

SEMICONDUCTOR DEVICE HAVING A REDUCED LEAKAGE CURRENT

TECHNICAL FIELD

The present invention relates generally to a semiconductor device and more particularly to a semiconductor device having circuitry using insulated gate field effect transistors (IGFETs) and improving leakage current through such devices.

BACKGROUND OF THE INVENTION

As sizes on devices such as metal oxide semiconductor field effect transistors (MOSFETs) have become smaller, device isolation techniques, such as conventional LOCOS (local oxidation of silicon), have been replaced with a STI (shallow trench isolation) method.

In FIG. 8(a), a top plan view of the layout of a conventional MOSFET is set forth. In FIG. 8(b), a cross-sectional view along the line A—A of conventional MOSFET is set forth.

Referring now to FIG. 8(a), the conventional MOSFET includes an active area ACT. The active area ACT defines the region in which the conventional MOSFET is to be confined. A polysilicon wiring POL crosses the active area to form a gate electrode GG. Impurities are implanted and diffused into the active area ACT on both sides of the polysilicon wiring POL to form a drain region DD and source region SS. STI is formed in an area surrounding the active area ACT in order to isolate the conventional MOSFET from other device elements. The STI is not illustrated in FIG. 8(a).

Referring now to FIG. 8(b), a cross sectional view along the line A—A of the conventional MOSFET of FIG. 8(a) is set forth.

As illustrated in FIG. 8(b), a gate oxide film GOX is formed as a gate isolation film on the semiconductor substrate SUB over the active area ACT. Polysilicon wiring POL forming the gate electrode GG is formed on top of the gate oxide film GOX across the active area ACT. Although not illustrated in FIG. 8(b), the drain and source regions are formed on both sides of the gate GG in the active area ACT. A trench is formed around the active area ACT and silicon oxide SOX is formed within the trench to form the STI structure.

As device structures continue to become smaller due to miniaturization, the gate width as well as the thickness of the gate oxide film GOX and gate length are reduced. In the case of a conventional MOSFET, which uses LOCOS as the isolation structure, the threshold voltage tends to rise due to a narrow channel effect when a gate width is reduced. On the other hand, in the case of a conventional MOSFET, which uses STI as the isolation structure, the threshold voltage tends to decrease near the boundary between the active area ACT and the STI (field area). This threshold voltage fluctuation will be described with reference to FIG. 9.

Referring now to FIG. 9, a cross-sectional view of a region of the conventional MOSFET illustrated in FIG. 8 is set forth. The region illustrated in FIG. 9, is the portion indicated by general reference character K in FIG. 8 and is a portion including a boundary between the active area ACT and the STI. The cross-sectional view of FIG. 9, illustrates a n-type MOSFET.

As illustrated in FIG. 9, the STI is the vertically formed silicon oxide SOX. In the case of a n-type MOSFET a p-type impurity such as boron (illustrated by B) is included in the substrate. At the interface region between the active area ACT and the silicon oxide SOX, boron B can out-diffuse and become trapped in the silicon oxide SOX. As a result, the impurity density is reduced around the boundary between the active area ACT and the STI. This causes the threshold voltage of the MOSFET to decrease in this area and can create an increase leakage current in this region.

Also, a ridge T in silicon oxide can be formed at the interface between the gate oxide GOX and silicon oxide SOX formed in the STI. The ridge T can cause an increased electric field produced in the region around the boundary of active area ACT and STI.

Thus, in the threshold voltage tends to be lower in the region near the boundary of the active region ACT and the STI structure. Also, the electric field in this region may be increased due to a ridge T produced in the silicon oxide. These effects can cause an increase in sub-threshold currents in this area, which increases power consumption.

On the other hand, when a LOCOS structure is used for device isolation, the field oxide region next to the active area ACT may be an arc or bird beak type structure. Thus, with the lower surface area at the interface, a smaller amount of impurities may out-diffuse from the channel area to the field area and the leakage current may not be increased to the same degree.

However, as disclosed in Japanese Patent Application Laid-Open 9-321277, it is pointed out that the threshold voltage tends to decrease when the LOCOS structure is used as well as when the STI structure is used.

Thus, in a conventional MOSFET, it is known that leakage current can be increased around the boundary between the active area ACT and a field area (such as STI or LOCOS). This is particularly the case when the gate width is reduced. To suppress the leakage current, methods have been disclosed in Japanese Patent Application Laid-Open No. 9-321277 and Japanese Patent Application Laid Open no. 2000-82808. The approach disclosed in Japanese Patent Application Laid-Open No. 9-321277 uses a leveled profile in the depth direction of a threshold voltage control layer. The approach disclosed in Japanese Patent Application Laid-Open No. 2000-82808 uses a barrier layer to suppress the out-diffusion of impurities.

However, in the above-mentioned conventional approaches, the method of suppressing the leakage current due to the decrease in gate width is accomplished by modifying the device structure. The modification of the device structure may be difficult from a process view-point and may not be effective due to non-ideal process results. This is particularly the case when used in a circuit that is manufactured in large quantities. Thus it can be difficult to effectively suppress the leakage current with these approaches. Also, when these methods are used, the average threshold voltage in a device may increase. This can lower the current driving ability of the MOSFET. In this way, the circuit operating speed is reduced.

Referring now to FIG. 10, a circuit schematic diagram of a conventional predecoder is set forth. The conventional predecoder is used to select a word line formed in a memory cell array in a semiconductor memory device. The conventional predecoder illustrated in FIG. 10, can be illustrative of a circuit in which sub-threshold leakage can cause undesired current consumption. The sub-threshold current leakage can be greatly magnified by the fact that such a conventional predecoder may be repeated a large number of times on a typical semiconductor memory device.

The conventional predecoder of FIG. 10 includes NAND gate circuits (GJ1 to GJ4). NAND gate circuits (GJ1 to GJ4) commonly receive address signal A and respectively receive activating address signals (B1 to B4). Address signal A is used to collectively select NAND gate circuits (GJ1 to GJ4) and address signals (B1 to B4) are used to individually select one of NAND gate circuits (B1 to GJ4). NAND gate circuits (GJ1 to GJ4) respectively produce output signals (D1 to D4).

Each NAND gate circuit (GJ1 to GJ4) has p-type MOSFETs (PJ1 and PJ2) and n-type MOSFETs (NJ1 and NJ2). P-type MOSFET PJ1 has a source connected to a power supply, a drain connected to the respective output node (D1 to D4) and a gate connected to address signal A. P-type MOSFET PJ2 has a source connected to a power supply, a drain connected to the respective output node (D1 to D4) and a gate connected to the respective address signal (B1 to B4). N-type MOSFET NJ1 has a source connected to a drain of n-type MOSFET NJ2, a drain connected to the respective output node (D1 to D4) and a gate connected to address signal A. N-type MOSFET NJ2 has a source connected to ground and a gate connected to the respective address signal (B1 to B4).

In the conventional predecoder, only one of NAND gate circuits (GJ1 to GJ4) is selected at one time. Thus, when address signal A is high, only one of address signals (B1 to B4) is high and only one NAND gate circuit (GJ1 to GJ4) produces a low output signal (D1 to D4).

A plurality of such conventional predecoders is provided on a semiconductor memory device and any one of the NAND gate circuits (GJ1 to GJ4) in each conventional predecoder is selected in accordance with the value of address signal A and address signals (B1 to B4).

In the standby mode, address signal A is fixed at a low level. Thus, all NAND gate circuits (GJ1 to GJ4) are placed in a non-selection state and all output signals (D1 to D4) are fixed at a high level by the respective MOSFET PJ1. At this time, the address signals (B1 to B4) are fixed at either a low or high level depending on the configuration of the circuit generating these signals. In this example, to illustrate a worst case leakage current, all address signals (B1 to B4) are fixed at the high level.

Thus, in the standby mode with address signal A at a low level and address signals (B1 to B4) at a high level, in each NAND gate circuit (GJ1 to GJ4) the n-type MOSFET NJ1 is turned off and the n-type MOSFET NJ2 is turned on. As a result, a power source potential is applied to the drain and a ground potential is applied to the source of n-type MOSFET NJ1. Under these conditions, the leakage current in the area around the boundary between the active area and field area (isolation area) of n-type MOSFET NJ1 can become problematic. This leakage current can occur in all such circuits that are biased in this manner during standby. Also, the leakage current created by this mechanism can increase proportionally to the circuit scale.

In view of the above discussion, it would be desirable to provide a semiconductor device that can effectively reduce the leakage current that may be caused by the reduction of the gate width of an insulated gate field effect transistor (IGFET). It would also be desirable to effectively decrease the leakage current without having adverse affects on the device operating speed.

SUMMARY OF THE INVENTION

According to the present embodiments, a semiconductor device includes a plurality of logic circuits and an insulated gate field effect transistor (IGFET). The IGFET may have a current path connected between each of the logic circuits and a reference supply node. Each logic circuit may have a logic output node that may be at a potential different than the reference supply when the IGFET is turned off. The IGFET may have a counter measure to reduce leakage caused by short channel effects when the IGFET is turned off. In this way, leakage current may be reduced.

According to one aspect of the embodiments, a semiconductor device may include a first IGFET having a first IGFET current path connected between a first node and a second node fixed at a first predetermined potential. The first IGFET may include a counter measure to reduce leakage current caused by short channel effects when the first IGFET is turned off. The first node may be at a second predetermined potential.

According to another aspect of the embodiments, a second IGFET may have a second IGFET current path connected between the first node and the first IGFET current path. The first IGFET may have a larger resistance to leakage current than the second IGFET.

According to another aspect of the embodiments, the countermeasure may be providing fewer first regions in which a first gate electrode overlaps a boundary between a first IGFET active region and a field region in the first IGFET than second regions in which a second gate electrode overlaps a boundary between a second IGFET active region and the field region in the second IGFET.

According to another aspect of the embodiments, the second IGFET may include a plurality of IGFETs connected in parallel to function as the second IGFET.

According to another aspect of the embodiments, the countermeasure may include providing a first IGFET gate electrode having a longer first IGFET gate length in a region in which the first gate electrode overlaps a boundary between a first IGFET active region and a field region than in a central region of the first IGFET.

According to another aspect of the embodiments, the countermeasure may include providing a first IGFET gate electrode having a ring shaped pattern.

According to another aspect of the embodiments, the counter measure may include having a higher impurity concentration in a region in which the first gate electrode overlaps a boundary between a first IGFET active region and a field region than in a central region of the first IGFET.

According to another aspect of the embodiments, a semiconductor device may include a plurality of logic circuits. A first reference supply node may provide a first predetermined potential to the plurality of logic circuits. A first IGFET may have a first IGFET current path connected between each of the logic circuits and the first reference supply node. Each logic circuit may include a logic output node that may be at a second potential different than the first predetermined potential when the first IGFET is turned off.

According to another aspect of the embodiments, each logic circuit may be a NND gate including a plurality of p-type IGFETs connected in parallel between a second reference supply node and the logic output node and at least one n-type IGFET connected between the logic output node and the first IGFET. The first IGFET may be a n-type IGFET and the semiconductor device may be a semiconductor memory device.

According to another aspect of the embodiments, the first IGFET may include a counter measure to reduce leakage current caused by short channel effects when the first IGFET is turned off.

According to another aspect of the embodiments, the counter measure may include providing fewer first regions in which a first gate electrode overlaps a boundary between a first IGFET active region and a field region in the first IGFET than second regions in which a second gate electrode overlaps a boundary between a second IGFET active region and the field region in a second IGFET connected between the first IGFET and the logic output node in at least one of the plurality of logic circuits.

According to another aspect of the embodiments, the counter measure may include providing a first IGFET gate electrode having a longer first IGFET gate length in a region in which the first gate electrode overlaps a boundary between a first IGFET active region and a field region than in a central region of the first IGFET.

According to another aspect of the embodiments, the counter measure may include providing a first IGFET gate electrode having a ring shaped pattern.

According to another aspect of the embodiments, the counter measure may include a first threshold voltage of the first IGFET that is higher than a second threshold voltage of a second IGFET connected between the first IGFET and the logic output node in at least one of the plurality of logic circuits.

According to another aspect of the embodiments, a semiconductor device may include a plurality of logic circuits electrically connected in series and divided into a first group of logic circuits and second group of logic circuits. A first reference supply node may provide a first predetermined potential to the plurality of logic circuits. A second reference supply node may provide a second predetermined potential to the plurality of logic circuits. A first conductivity type IGFET may have a current path connected between each of the first group of logic circuits and the second reference supply node. The first group of logic circuits may be connected to the second reference supply node and the second group of logic circuits may be connected to the first reference supply node.

According to another aspect of the embodiments, the first conductivity type IGFET may include a counter measure to reduce leakage current when turned off.

According to another aspect of the embodiments, the counter measure may include providing fewer first regions in which a first gate electrode overlaps a boundary between a first active region and a field region in the first conductivity type IGFET than second regions in which a second gate electrode overlaps a boundary between a second active region and the filed region in another first conductivity type IGFET connected between the first conductivity type IGFET and a logic output node in at least one of the first group of logic circuits.

According to another aspect of the embodiments, the counter measure may include providing a first gate electrode having a longer gate length in a region in which the first gate electrode overlaps a boundary between a first active region and a field region than in a central region of the first conductivity type IGFET.

According to another aspect of the embodiments, the counter measure may include providing a first gate electrode having a ring shaped pattern.

According to another aspect of the embodiments, the first conductivity type may be n-type. The second conductivity type may be p-type. All IGFETs may be metal oxide semiconductor field effect transistors (MOSFETs).

DETAILED DESCRIPTION OF THE EMBODIMENTS

Various embodiments of the present invention will now be described in detail with reference to a number of drawings.

Embodiment 1

The semiconductor device according to the first embodiment of the present invention may include a method of reducing a leakage current that may become enhanced due to a reduction of a gate width of an insulated gate field effect transistor (IGFET). The IGFET may be a metal oxide semiconductor field effect transistor (MOSFET) in a dynamic random access semiconductor (DRAM) and may be in an off state with a potential difference between a source and drain, as just one example.

In the following description, a "leakage current" may refer to a leakage current component that may appear in the area of a boundary between the active area and field area (isolation area) under the gate electrode. The leakage current may be caused by the out-diffusion of impurities or an increased electric field, etc, in an IGFET having an STI structure used for device isolation as previously described.

The semiconductor device may include a plurality of logic circuits configured using IGFETs. The plurality of logic circuits may include an IGFET having a controllable current path or impedance connected between a signal node and ground. The IGFET may have a may have a controllable impedance path that may be shared among a plurality of logic circuits. According to the first embodiment, the plurality of logic circuits may form a part of a predecoder and may include a NAND gate as a logic circuit.

Figure 1:
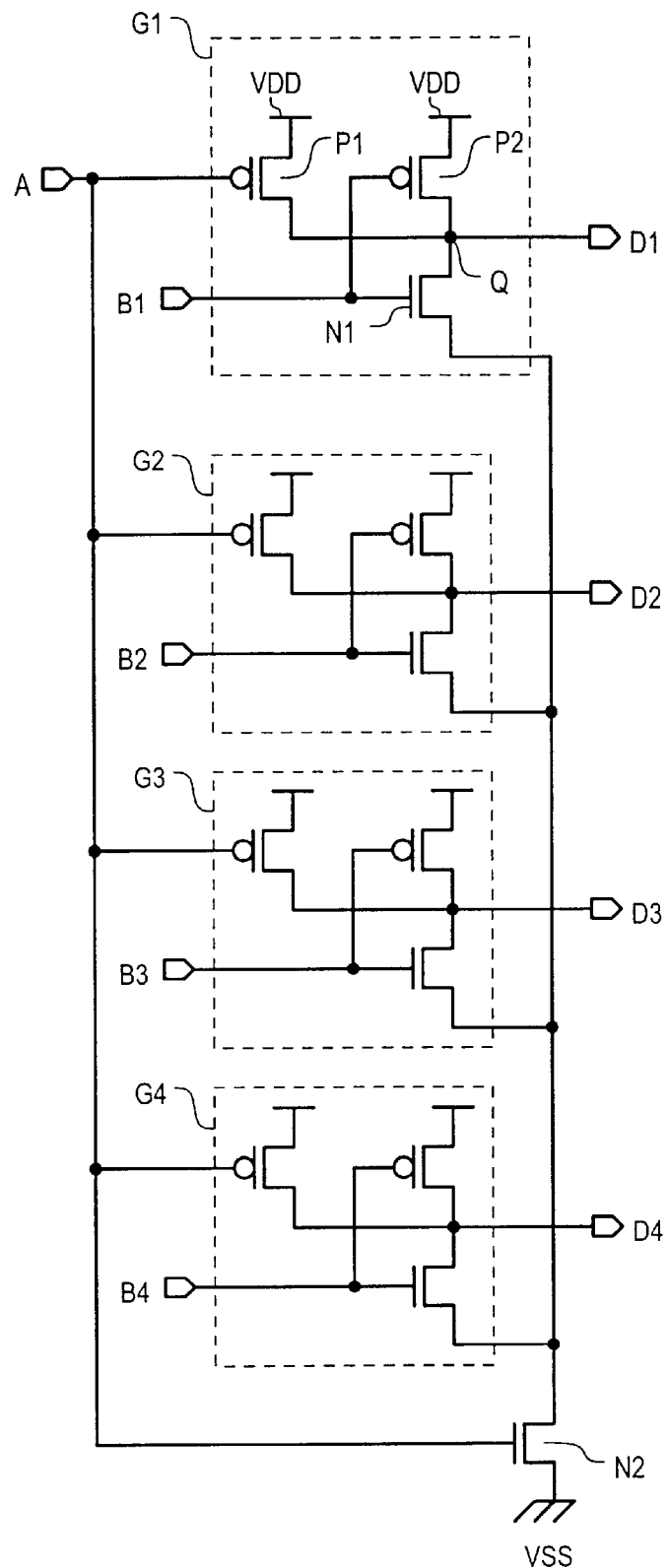
FIG. 1 is a circuit schematic diagram of a portion of a predecoder in accordance with a first embodiment.

Referring now to FIG. 1, a circuit schematic diagram of a portion of a predecoder in accordance with the first embodiment is set forth and given the general reference character 100.

Predecoder 100 may include a plurality of logic circuits (G1 to G4) and an n-type IGFET N2.

Each logic circuit (G1 to G4) may include a NAND gate. Each logic circuit (G1 to G4) may include p-type IGFETs (P1 and P2) and n-type IGFET N1. P-type IGFET P1 may have a source connected to a power source VDD, a drain connected to an output node Q, and a gate connected to an address signal A. P-type IGFET P2 may have a source connected to a power source VDD, a drain connected to an output node Q, and a gate connected to an address signal B1. N-type IGFET N1 may have a drain connected to output node Q, a gate connected to address signal B1, and a source connected to the drain of an n-type IGFET N2. The output node Q in each logic circuit (G1 to G4) may be connected to provide a signal (D1 to D4), respectively.

N-type IGFET N2 may have a source connected to ground VSS, a gate connected to address signal A, and a drain connected to the source of n-type IGFET N1 in each logic circuit (G1 to G4). In this way, n-type IGFET N2 may commonly provide ground VSS to each logic circuit (G1 to G4) or commonly isolate each logic circuit (G1 to G4 from ground in accordance with the logic level of address signal A.

When predecoder 100 is operating in a mode such as a read or write mode, for example, predecoder 100 may be selected by address signal A being at a high level. When address signal A is high, p-type IGFET P1 in each logic circuit (G1 to G4) may be turned off. N-type IGFET N2 may be turned on and ground VSS may be applied to the source of n-type IGFET N1 in each logic circuit (G1 to G4). Then, a logic circuit (G1 to G4) may be selected in accordance with the logic values of address signals (B1 to B4). If the respective address signal (B1 to B4) is high, then the respective n-type IGFET N1 may be turned on and the respective p-type IGFET P2 may be turned off, thus the respective signal (D1 to D4) may become low. If address signal B1 is high, logic circuit G1 may be selected and signal D1 may become low. If address signal B2 is high, logic circuit G2 may be selected and signal D2 may become low. If address signal B3 is high, logic circuit G3 may be selected and signal D3 may become low. If address signal B4 is high, logic circuit G4 may be selected and signal D4 may become low. In accordance, when predecoder 100 is selected by address signal A becoming high, one of address signals (B1 to B4) may become high and one of signals (D1 to D4) may become low accordingly.

Accordingly, in the logic circuits (G1 to G4) in which the respective address signal (B1 to B4) is low, the respective n-type IGFET N1 may be turned off and the respective p-type IGFET P2 may be turned on, thus the respective signal (D1 to D4) may become high. It is noted that only one address signal (B1 to B4), thus only one signal (D1 to D4) may become low.

Thus, when address signal A and one of address signals (B1 to B4) is high and the other three address signals (B1 to B4) are low, three of the logic circuits (G1 to G4) in predecoder 100 may have an output node Q that is high. Thus, the drain of the respective n-type IGFET N1 may be high (VCC), while the source of the respective n-type IGFET N1 may be at ground VSS. This may create a leakage current through these n-type IGFETs N1. These currents may not be reduced.

The operation of predecoder 100 in a standby mode will now be described.

In the standby mode, an address signal generation circuit (not shown) may fix address signal A to the low level. P-type IGFET P1 in logic gates (G1 to G4) may be turned on and n-type IGFET N2 may be turned off. Thus, regardless of the levels of address signals (B1 to B4), signals (D1 to D4) may all be high.

It is noted that the current path to ground from output node Q in each logic circuit (G1 to G4) may go through the respective n-type IGFET N1 and n-type IGFET N2. Thus, leakage current from any logic circuit (G1 to G4) may go through n-type IGFET N2. If any of address signals (B1 to B4) are high, the potential at the drain of n-type IGFET N2 can be high (VDD−Vt, where Vt is the threshold voltage of an n-type IGFET). However, the potential at the drain of n-type IGFET N2 may be the same whether only one of address signals (B1 to B4) is high or whether all of address signals (B1 to B4) are high. In this case, even if all address signals (B1 to B4) are high, the leakage current may be the leakage current of only one n-type IGFET (in this case, n-type IGFET N2). This may reduce the leakage current in the standby mode.

As described above, according to the first embodiment, the leakage current of gate circuit (G1 to G4) my be limited by n-type IGFET N2 in any operational mode in which n-type IGFET N2 may be turned off. This may reduce wasted current and reduce overall power consumption.

Embodiment 2

A second embodiment of the present invention will now be discussed.

According to the above-mentioned first embodiment, a plurality of logic circuits may share n-type IGFET N2. However, in the second embodiment, a transistor may be designed so that leakage current may be reduced when turned off. Thus, wasted current may be reduced.

For area efficiency of the physical layout of an IGFET, the IGFET may be divided into a plurality of smaller IGFETs that may be connected in parallel. However, in embodiment 2, an IGFET that may be turned off in a mode, may have a reduction in the division into a plurality of smaller IGFETs. In this way, the number of increased leakage current paths may be reduced by reducing the number of regions under a gate electrode that are near an interface between an active region and a field region.

Figure 2:
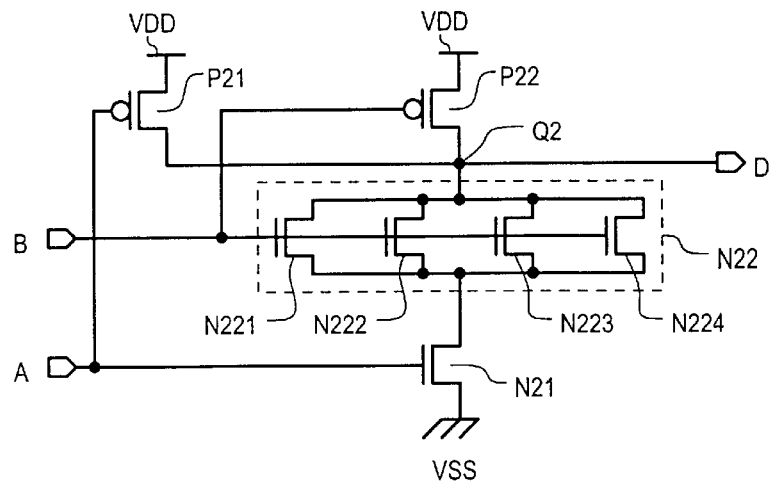
FIG. 2 is a circuit schematic diagram of a logic circuit in accordance with a second embodiment.

Referring now to FIG. 2, a circuit schematic diagram of a logic circuit in accordance with the second embodiment is set forth and given the general reference character 200. Logic circuit 200 may form a NAND logic gate, as just one example.

Logic circuit 200 may include p-type IGFETs (P21 and P22) and n-type IGFETs (N21 and N22). P-type IGFET P21 may have a source connected to a power source VDD, a drain connected to an output node Q2, and a gate connected to a signal A. P-type IGFET P22 may have a source connected to a power source VDD, a drain connected to an output node Q2, and a gate connected to a signal B. N-type IGFET N21 may have a source connected to ground VSS, a drain connected to a source of n-type IGFET N22, and a gate connected to signal A. N-type IGFET N22 may have a source connected to a drain of n-type IGFET N21, a drain connected to output node Q2, and a gate connected to signal B. Output node Q2 may be connected to signal D. N-type IGFETs (N21 and N22) may be n-type MOSFETs, as just one example. P-type IGFETs (P21 and P22) may be p-type MOSFETs, as just one example.

N-type IGFET N22 may be physically divided into n-type IGFETs (N221 to N224). N-type IGFETs (N221 to N224) may be connected in parallel and may each have a source commonly connected to a drain of n-type IGFET N21, a drain commonly connected to output node Q2, and a gate commonly connected to signal B. N-type IGFET N22 may be physically divided into n-type IGFETs (N221 to N224) for efficiency and convenience of the layout.

By dividing N-type IGFET N22 into n-type IGFETs (N221 to N224), the number of current leakage paths, that may have an increased leakage current due to regions under a gate electrode that are near an interface between an active region and a field region, may be increased. In this way, n-type IGFET N22 may have an increased leakage current.

Referring now to FIG. 3(a), a top plan view of the layout of n-type IGFET N22 of FIG. 2 is set forth.

As illustrated in FIG. 3(a), n-type IGFET N22 may include a comb-shaped polysilicon later POL over an active area ACT. The comb shaped polysilicon layer POL may provide a gate electrode GG for n-type IGFETs (N221 to N224) having a gate width W. The sources SS of n-type IGFETs (N221 to N224) may be commonly connected through a wiring layer and the drains DD of n-type IGFETs (N221 to N224) may be commonly connected through a wiring layer. In this way, n-type IGFETs (N221 to N224) may collectively form n-type IGFET N22 having a gate width 4W. A division of an IGFET in such a manner is commonly performed for layout efficiency.

Referring now to FIG. 3(b), a top plan view of the layout of n-type IGFET N21 of FIG. 2 is set forth.

As illustrated in FIG. 3(b), n-type IGFET N21 may not be divided into a plurality of n-type IGFETs in the manner of n-type IGFET N22. N-type IGFET N21 may include a rectangular active area ACT and an I-shaped polysilicon layer POL providing a single gate electrode GG. In this way, n-type IGFET N21 may include a single gate GG, single drain DD, and a single source SS. By doing so, regions under a gate electrode that are near an interface between an active region and a field region may be limited to two regions as illustrated by regions (B1 and B2) on the ends of n-type IGFET N21.

It is noted, that the form of n-type IGFET N21 may not be limited to this example, but may be arbitrarily formed to reduce the number of regions under a gate electrode that are near an interface between an active region and a field region.

Figure 3:
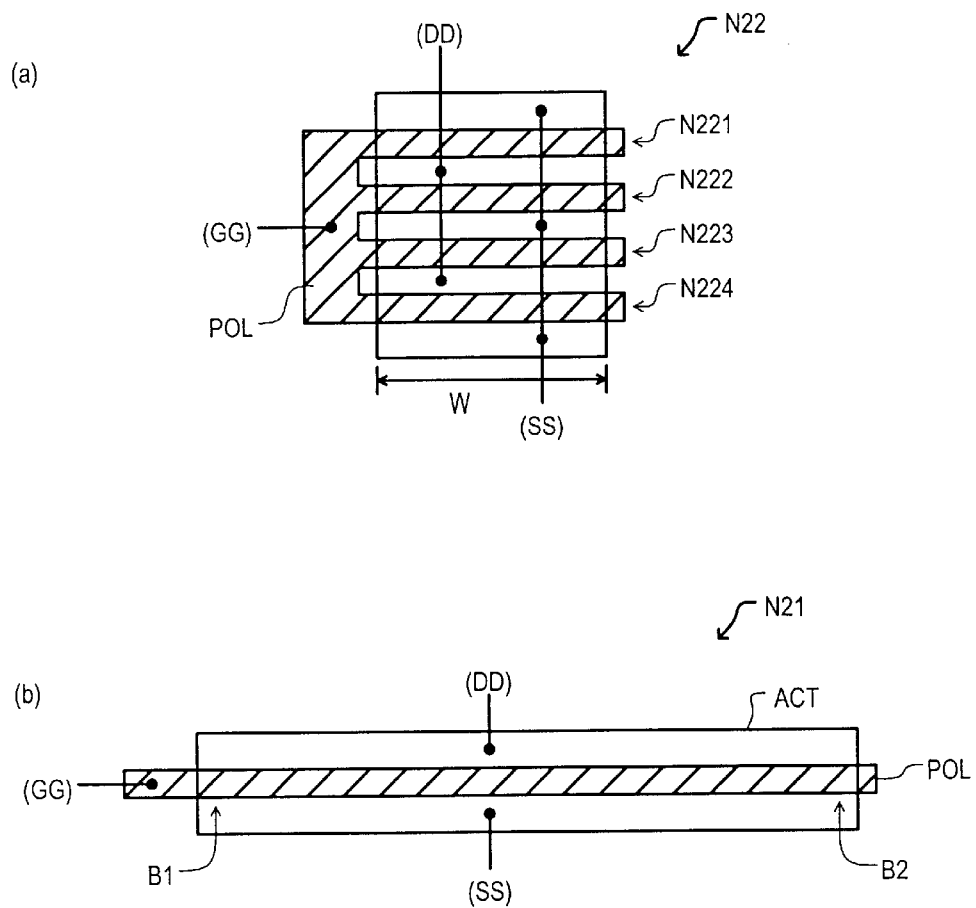
FIG. 3(a) is a top plan view of the layout of a n-type IGFET of FIG. 2.
FIG. 3(b) is a top plan view of the layout of a n-type IGFET of FIG. 2.

The operation of the second embodiment will now be described with reference to FIGS. 2 and 3.

In the standby mode, signal A may be low while signal B may be either high or low. In the discussion, it can be assumed that signal B may be high in the standby mode. With signal A low, n-type IGFET N21 may be turned off and p-type IGFET P21 may be turned on. As a result, output node Q2 may be high (VDD). With signal B high, n-type IGFET N22 may be turned on and p-type IGFET P22 may be turned off. With n-type IGFET N22 turned on, a potential of VDD-Vt may be applied to the drain of n-type IGFET N21 while ground VSS may be applied to the source.

In n-type IGFET N21, there may be only two regions under a gate electrode that are near an interface between an active region and a field region as illustrated by regions (B1 and B2) in FIG. 3(b). Thus, there may be only two regions (B1 and B2) in which there may be an increased leakage current. By limiting the number of such regions, leakage current may be reduced. Thus, regardless of the current drive capabilities or leakage current regions in n-type IGFET N22, the leakage current may be effectively reduced by n-type IGFET N21.

In this example, the operation in a standby mode has been described. However, in other operation modes, such as a write mode, read mode, etc, the leakage current may be similarly reduced thereby reducing the overall current consumption of the semiconductor device.

According to the second embodiment as described above, the leakage current may be limited by n-type IGFET N21. In this way, the leakage current may not be dependent on n-type IGFET N22 as a current path between the power source VDD and ground VSS or the current paths of p-type IGFETs (P21 and P22). Therefore, leakage current paths of the above-mentioned IGFETs (P21, P22, and N22) may not restrict the design of the layout of these IGFETs (P21, P22, and N22), so that they may be physically disposed with layout efficiency maximized.

Referring now to FIGS. 4(a)–(d), top plan views of layouts for various n-type IGFETs according to an embodiment are set forth. The n-type IGFETs illustrated in FIGS. 4(a)–(d) may be used as n-type IGFET N21 in FIG. 2, as just one example.

Figure 4:
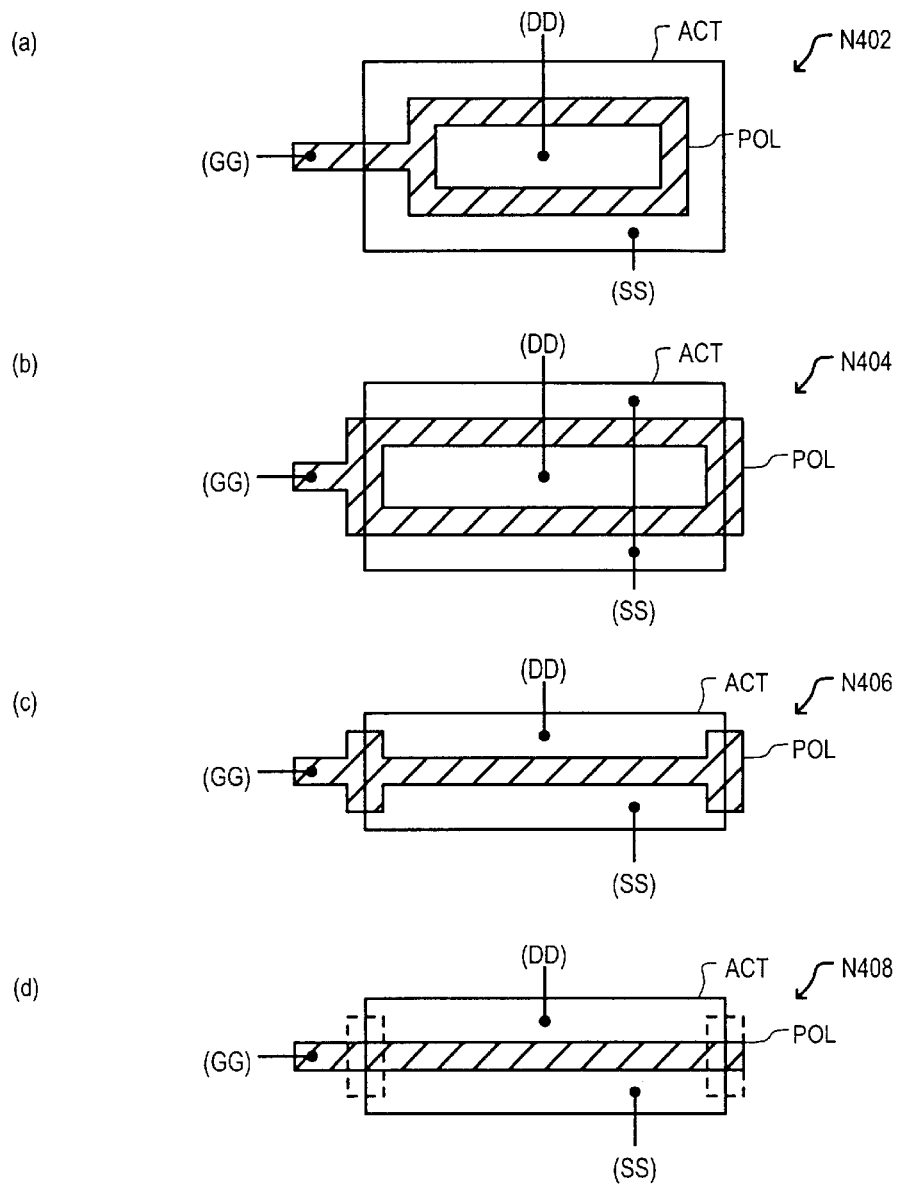
FIGS. 4(a)–(d) are top plan views of layouts for various n-type IGFETs according to an embodiment.

In the example illustrated in FIG. 4(a), n-type IGFET N402 may include a ring-shaped polysilicon structure POL that may be used as a gate electrode GG. In this example, the active area ACT may include an internal area that can be a drain region DD and an external area that may be used as a source region SS. In this way, there may be only one region under a gate electrode GG that are near an interface between an active region ACT and a field region. By doing so, the areas in which an increased leakage current may exist can be reduced. This may reduce leakage current and reduce overall current consumption.

In the example illustrated in FIG. 4(b), n-type IGFET N404 may include a ring-shaped polysilicon structure POL that may be used as a gate electrode GG. In this example, the active area ACT may include an internal area that can be a drain region DD and two external areas that may be used as a source region SS. In this case, the ring shaped polysilicon structure POL may overlay the boundary of the interface between an active region ACT and a field region. In this way, the channel length in this area may be increased and the short channel effects may be reduced. By doing so, the areas in which an increased leakage current may exist can be reduced. This may reduce leakage current and reduce overall current consumption. This method may be used to form an IGFET having a large channel width while reducing leakage current.

In the example illustrated in FIG. 4(c), n-type IGFET N406 may include a polysilicon structure POL that may be used as a gate electrode GG. The active area ACT may include a drain region DD and a source region SS that may be separated by the gate electrode GG. The polysilicon structure POL may include gate electrode GG ends that may be extended in the longitudinal direction of the channel over the interface between the active region ACT and the field region. In this way, the channel length in this area may be increased and the short channel effects may be reduced. By doing so, the areas in which an increased leakage current may exist can be reduced. This may reduce leakage current and reduce overall current consumption.

In the example illustrated in FIG. 4(d), n-type IGFET N408 may include regions (illustrated by a dashed line) in which the impurity concentration may be increased thereby increasing the threshold voltage in this region. By doing so, the areas in which an increased leakage current may exist can be reduced. This may reduce leakage current and reduce overall current consumption.

The controlled impurity concentration region of n-type IGFET N408 as illustrated in FIG. 4(d) may be combined with the examples of n-type IGFETs (N402 to N406) illustrated in FIGS. 4(a)–(c) to provide an n-type IGFET that may further reduce leakage current.

Figure 5:
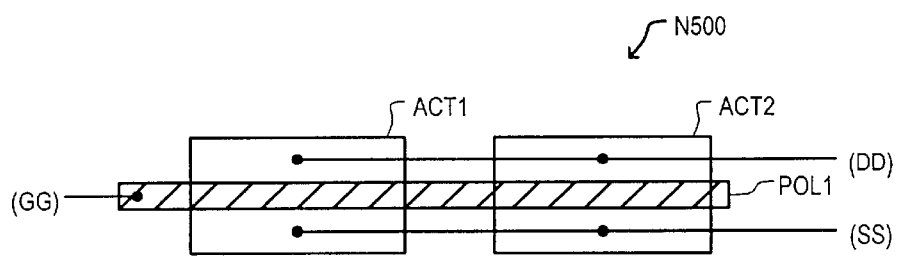
FIG. 5 is a top plan view of the layout of an undesired n-type IGFET.

For illustrative purposes, an example of an undesired n-type IGFET is set forth in FIG. 5. Referring now to FIG. 5, a top plan view of the layout of an undesired n-type IGFET is set forth and given the general reference character N500.

N-type IGFET N500 is obtained by dividing an active are into active area ACT1 and active area ACT2 and providing a polysilicon structure POL over both active areas (ACT1 and ACT2). In this way, n-type IGFET N500 may be formed having a drain DD and source SS and gate electrode GG. In this case, there are four regions under a gate electrode GG that are near an interface between an active region ACT and a field region. However, the present invention does not eliminate such a structure if techniques according to the invention are incorporated so that leakage current may be reduced.

As disclosed in accordance with the second embodiment, leakage current may be effectively reduced in a logic circuit 200 (for example).

Embodiment 3

In the first embodiment, the n-type IGFET N2 may be shared among a plurality of logic circuits. In the third embodiment, as will be discussed, an IGFET having a reduced leakage current may be commonly connected between a plurality of IGFETs that may be turned off and a reference potential in which current may leak. The IGFET may be turned off and may reduce leakage current to or from the reference potential.

Figure 6:
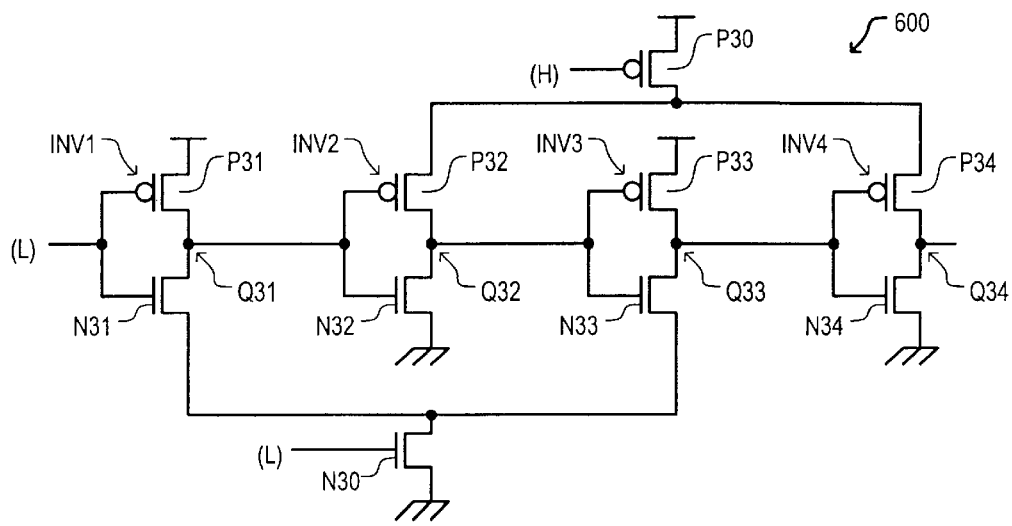
FIG. 6 is a circuit schematic diagram of a chain of logic circuits in accordance with a third embodiment.

Referring now to FIG. 6, a circuit schematic diagram of a chain of logic circuits in accordance with the third embodiment is set forth and given the general reference character 600. The chain of logic circuits 600 may be a chain of inverters, as just one example.

The chain of logic circuits 600 may include inverters (INV1 to INV4), n-type IGFET N30 and p-type IGFET P30.

P-type IGFET P30 may have a source connected to a power supply, a drain connected to a source of p-type IGFETs (P32 and P34), and a gate connected to an input signal. N-type IGFET N30 may have a source connected to ground, a drain connected to a source of n-type IGFETs (N31 and N33), and a gate connected to an input signal.

Each inverter may include a p-type IGFET and an n-type IGFET. For example, inverter INV1 may include p-type IGFET P31 and n-type IGFET N31. Inverter INV2 may include p-type IGFET P32 and n-type IGFET N32. Inverter INV3 may include p-type IGFET P33 and n-type IGFET N33. Inverter INV4 may include p-type IGFET P34 and n-type IGFET N34.

Inverter INV1 may include a p-type IGFET P31 having a source connected to a power source, a drain connected to node Q31 and a gate connected to an input signal. N-type IGFET N31 may have a source connected to the drain of n-type IGFET N30, a drain connected to node Q31 and a gate connected to the input signal.

Inverter INV2 may include a p-type IGFET P32 having a source connected to a drain of p-type IGFET P30, a drain connected to node Q32 and a gate connected to node Q31. N-type IGFET N32 may have a source connected to ground, a drain connected to node Q32 and a gate connected to node Q31.

Inverter INV3 may include a p-type IGFET P33 having a source connected to a power source, a drain connected to node Q33 and a gate connected to node Q32. N-type IGFET N33 may have a source connected to the drain of n-type IGFET N30, a drain connected to node Q33 and a gate connected to node Q32.

Inverter INV4 may include a p-type IGFET P34 having a source connected to a drain of p-type IGFET P30, a drain connected to node Q34 and a gate connected to node Q33. N-type IGFET N34 may have a source connected to ground, a drain connected to node Q34 and a gate connected to node Q33.

P-type IGFET P30 may provide a controllable impedance path between a power source and the even inverters (INV2 and INV4). N-type IGFET N30 may provide a controllable impedance path between ground and the odd inverters (INV1 and INV3).

The operation of the chain of logic circuits 600 in a standby mode will now be described.

In a standby mode, inverter INV1 may receive a low level input. P-type IGFET P30 may receive a high level input at a gate electrode. N-type IGFET N30 may receive a low level input at a gate electrode.

With inverter INV1 receiving a low level input, p-type IGFET P31 may be turned on and n-type IGFET N31 may be turned off. In this way, a high level may be applied to node Q31 which may be applied as an input to inverter INV2. With inverter INV2 receiving a high level input, p-type IGFET P32 may be turned off and n-type IGFET N32 may be turned on. In this way, a low level may be applied to node Q32 which may be applied as an input to inverter INV3. With inverter INV3 receiving a low level input, p-type IGFET P33 may be turned on and n-type IGFET N33 may be turned off. In this way, a high level may be applied to node Q33 which may be applied as an input to inverter INV4. With inverter INV4 receiving a high level input, p-type IGFET P34 may be turned off and n-type IGFET N34 may be turned on. In this way, a low level may be applied to node Q34 and may be output from the chain of logic circuits 600.

Because p-type IGFET P30 receives a high level, p-type IGFET P30 may be turned off and may isolate inverters (INV2 and INV4) from the power supply. Because n-type IGFET N30 receives a low level, n-type IGFET N30 may be turned off and may isolate inverters (INV1 and INV3) from ground.

Because nodes (Q31 and Q33) are high and n-type IGFETs (N31 and N33) are turned off, a leakage current may exist in these IGFETs. However, because n-type IGFET N30 may be turned off and connected between n-type IGFETs (N31 and N33) and ground, the leakage current may be limited by the leakage current in n-type IGFET N30. By providing n-type IGFET N30 as a reduced leakage current device, leakage current may be reduced.

Because nodes (Q32 and Q34) are low and p-type IGFETs (P32 and P34) are turned off, a leakage current may exist in these IGFETs. However, because p-type IGFET P30 may be turned off and connected between p-type IGFETs (P32 and P34) and the power supply, the leakage current may be limited by the leakage current in p-type IGFET P30. By providing p-type IGFET P30 as a reduced leakage current device, leakage current may be reduced.

According to the third embodiment, n-type IGFET N30 may isolate a plurality of logic gates from a reference voltage in which leakage current may flow in a selected operating state. In the example, illustrated, the reference voltage may be ground and the operating state may be a standby state.

Likewise, p-type IGFET P30 may isolate a plurality logic gates from a reference voltage in which leakage current may flow in a selected operating state. In the example, illustrated, the reference voltage may be a power supply and the operating state may be a standby state.

The example has been illustrated with respect to a standby mode of operation, however, the embodiments may be applicable to reduce leakage current in other modes of operation as well, for example, a read mode or a write mode, just to name a few.

As illustrated, n-type IGFET N30 may provide an effective method of reducing a leakage current in a plurality of logic circuits, such as inverters (INV1 and INV3). Likewise, p-type IGFET P30 may provide an effective method of reducing a leakage current in a plurality of logic circuits, such as inverters (INV2 and INV4). This may be done by providing a common current leakage path from the plurality of logic circuits. The common current leakage path may have limited leakage current. In this way, the leakage current may not be dependent upon leakage current in devices in the logic circuit or the number of logic circuits. The leakage current may be limited by the common current leakage path instead. By providing the common current leakage path as a reduced leakage current path, leakage current may be effectively controlled.

In the chain of logic circuits 600, n-type IGFET N30 may be connected to provide a leakage current path from the odd logic circuits, such as inverters (INV1 and INV3), while p-type IGFET P30 may be connected to provide a leakage current path from the even logic circuits, such as inverters (INV2 and INV4). However, depending on the desired logic level of the signals transmitted from the logic circuits, p-type IGFET P30 and n-type IGFET N30 may be connected to any of the plurality of logic circuits as necessary. As just one example, n-type IGFET N30 may be connected to even logic circuits, while p-type IGFET P30 may be connected to odd logic circuits.

Although, an n-type IGFET N30 and p-type IGFET P30 has been provided to limit leakage current, the invention should not be limited as such. As just one example, only one IGFET may be needed if a particular leakage path dominates leakage current.

Embodiment 4

Figure 7:
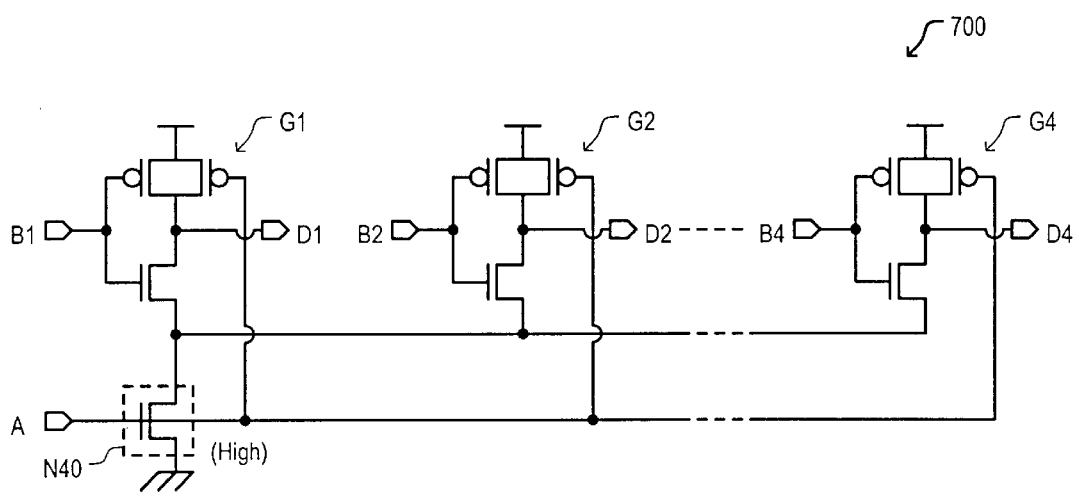
FIG. 7 is a circuit schematic diagram of a portion of a predecoder in accordance with a fourth embodiment.
Figure 8:
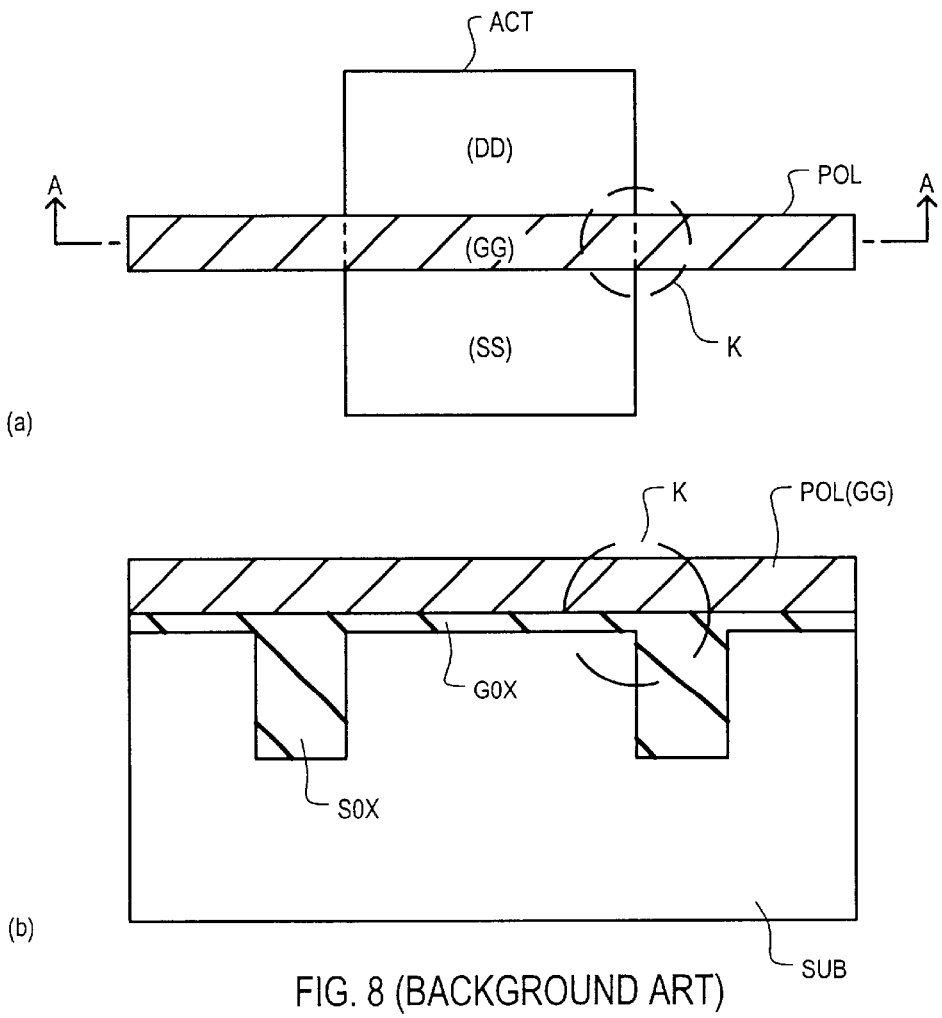
FIG. 8(a) is a top plan view of the layout of a conventional MOSFET.
FIG. 8(b) is a cross-sectional view of a conventional MOSFET.
Figure 9:
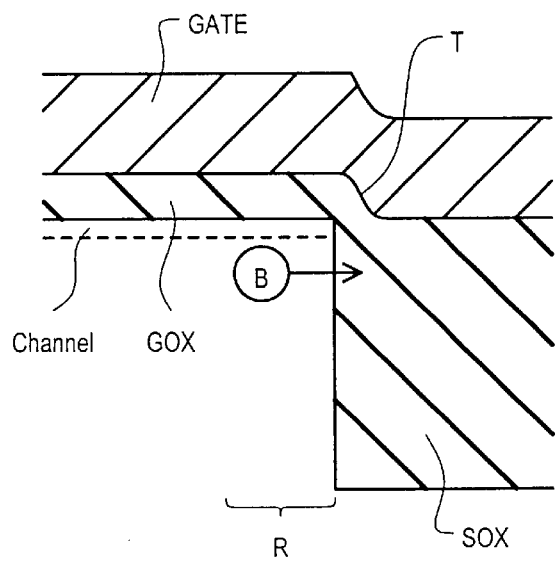
FIG. 9 is a cross-sectional view of a region of the conventional MOSFET illustrated in FIG. 8.
Figure 10:
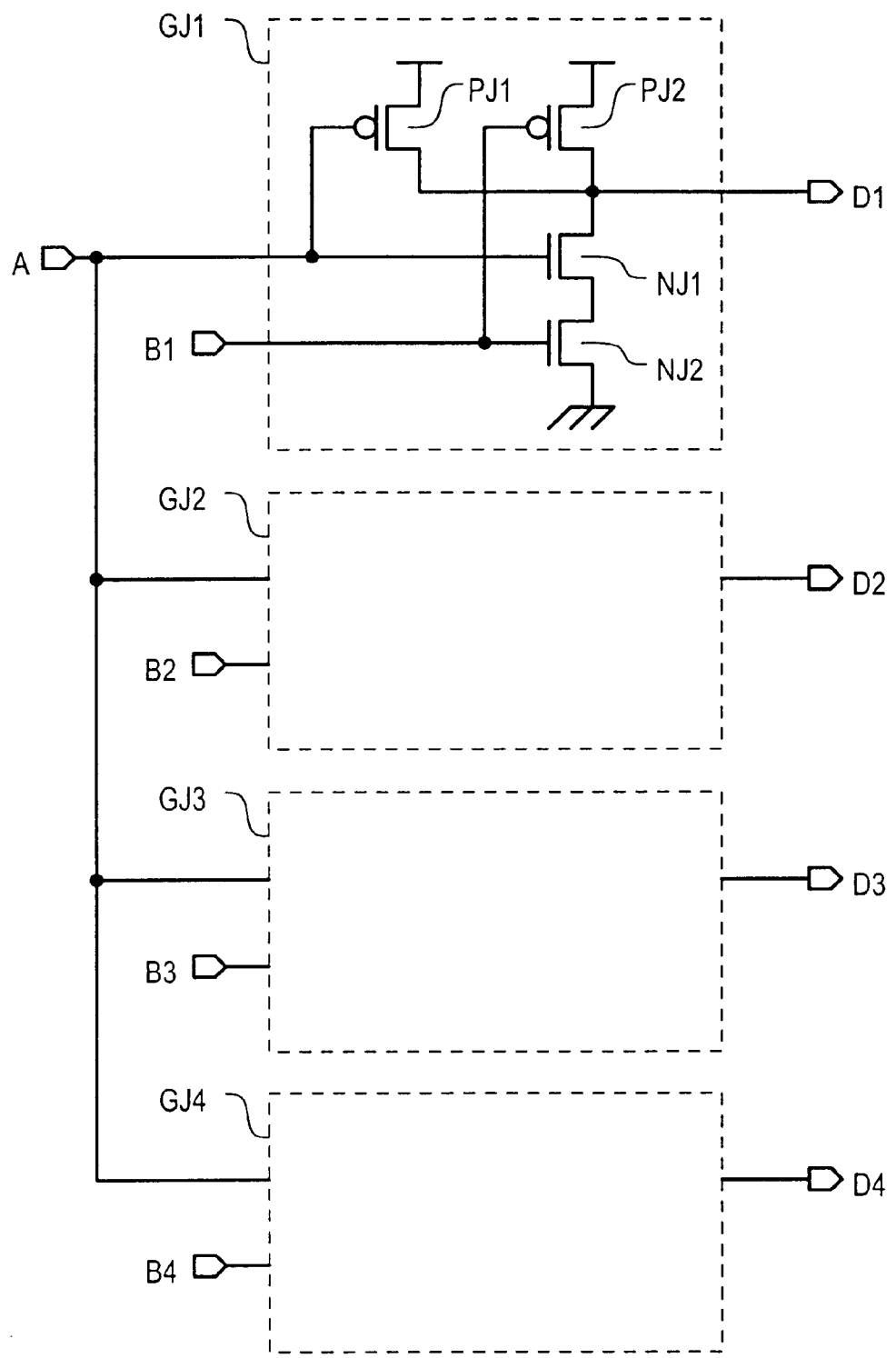
FIG. 10 is a circuit schematic diagram of a conventional predecoder.

Referring now to FIG. 7, a circuit schematic diagram of a portion of a predecoder in accordance with a fourth embodiment is set forth and given the general reference character 700.

Predecoder 700 may be configured and operate in a similar manner to the operation of predecoder 100 illustrated in the first embodiment.

Predecoder 700 may include a plurality of logic circuits (G1 to G4) and an n-type IGFET N40. N-type IGFET N40 may have a threshold voltage that may be higher than a typical n-type IGFET on the semiconductor device.

Because the n-type IGFET N40 may have a threshold voltage that is high as compared to, for example n-type IGFET N2 of the first embodiment, the sub-threshold current of n-type IGFET N40 may be reduced. Also, when the threshold voltage of n-type IGFET N40 is relatively high, the impurity density in a region under the gate electrode around the boundary between the active area and the field may be higher. In this way, the reduction of the impurity density in this region due to outdiffusion may be reduced. This may decrease the leakage current in this region. As a result, the leakage current may be further reduced in the fourth embodiment as compared to the first embodiment.

According to the fourth embodiment, n-type IGFET N40 may have an increased threshold voltage. However, the present invention should not be limited as such. Other methods may be used to reduce the leakage current, for example, the layout of n-type IGFET N40 may be modified in manners similar to the second embodiment or impurities may be selectively injected in the region under the gate electrode around the boundary between the active area and the field so as to compensate for the outdiffusion, as just two examples.

It is understood that the embodiments described above are exemplary and the present invention should not be limited to those embodiments. Specific structures should not be limited to the described embodiments.

Concepts illustrated in a particular embodiment may be applied to other embodiments as well.

For example, a leakage current may be reduced using an IGFET including a source area, drain area, and gate electrode as illustrated in the second embodiment. However, this concept may also be applied to the first, third, and fourth embodiments as well.

According to the second embodiment, a leakage current may be reduced using an IGFET having a ring-shaped gate electrode. This concept may also be applied to the first, third, and fourth embodiments as well.

According to the second embodiment, a leakage current may be reduced using an IGFET having an IGFET whose gate may be extended in the region around the boundary between the active area and the field. This concept may also be applied to the first, third, and fourth embodiments as well.

According to the second embodiment, a leakage current may be reduced using an IGFET having an increased impurity concentration under the gate electrode in the region around the boundary between the active area and the field. This concept may also be applied to the first, third, and fourth embodiments as well.

According to the second embodiment, a leakage current may be reduced using an IGFET having an increased threshold voltage. This concept may also be applied to the first, third, and fourth embodiments as well.

In the embodiments, a semiconductor memory has been used as an example, however, the present invention may be applied to any semiconductor device.

IGFETs illustrated in the embodiments may be metal oxide semiconductor field effect transistors (MOSFETs), as just one example.

In accordance with the embodiments, a leakage current, that may become problematic as gate length is reduced, can be reduced. This may be accomplished by providing a device having a reduced leakage current in the leakage path. The reduced leakage current device may provide a leakage path for a plurality of circuits. The device may be an IGFET, such as a MOSFET, as just one example. In this way, wasted current may be reduced and overall current consumption may be reduced.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
   a first insulated gate field effect transistor (IGFET) having a first IGFET current path connected between a first node and a second node fixed at a first predetermined potential; and
   wherein the first IGFET includes a counter measure to reduce leakage current caused by short channel effects in a region near a boundary between a first IGFET active region and a field region when the first IGFET is turned off and the first node is at a second predetermined potential.

2. The semiconductor device according to claim 1, further including:

a second IGFET having a second IGFET current path connected between the first node and the first IGFET current path; and the first IGFET having a larger resistance to leakage current than the second IGFET.

3. The semiconductor device according to claim 1, wherein:

a second IGFET having a second IGFET current path connected between the first node and the first IGFET current path;

wherein the counter measure is providing fewer first regions in which a first gate electrode overlaps the boundary between the first IGFET active region and the field region in the first IGFET than second regions in which a second gate electrode overlaps a boundary between a second IGFET active region and the field region in the second IGFET.

4. The semiconductor device according to claim 3, wherein:

the second IGFET includes a plurality of IGFETs connected in parallel to function as the second IGFET.

5. The semiconductor device according to claim 1, wherein:

a second IGFET having a second IGFET current path connected between the first node and the first IGFET current path;

wherein the counter measure is providing a first IGFET gate electrode having a longer first IGFET gate length in a region in which the first gate electrode overlaps the boundary between the first IGFET active region and the field region than in a central region of the first IGFET.

6. The semiconductor device according to claim 1, wherein:

a second IGFET having a second IGFET current path connected between the first node and the first IGFET current path;

wherein the counter measure is providing a first IGFET gate electrode having a ring shaped pattern.

7. The semiconductor device according to claim 1, wherein:

a second IGFET having a second IGFET current path connected between the first node and the first IGFET current path;

wherein the counter measure is having a higher impurity concentration in a region in which the first gate electrode overlaps the boundary between the first IGFET active region and the field region than in a central region of the first IGFET.

8. The semiconductor device, comprising:

a plurality of logic circuits;

a first reference supply node providing a first predetermined potential to the plurality of logic circuits;

a first IGFET having a first IGFET current path connected between each of the logic circuits and the first reference supply node; and each logic circuit includes a logic output node that is at a second potential different than the first predetermined potential when the first IGFET is turned off wherein the first IGFET includes a counter measure to reduce leakage current caused by short channel effects in a region near a boundary between a first IGFET active region and a field region when the first IGFET is turned off.

9. The semiconductor device according to claim 8, wherein:

each logic circuit is a NAND gate including a plurality of p-type IGFETs connected in parallel between a second reference supply node and the logic output node and at least one n-type IGFET connected between the logic output node and the first IGFET;

the first IGFET is a n-type IGFET; and the semiconductor device is a semiconductor memory device.

10. The device according to claim 8, wherein:

the counter measure is providing fewer first regions in which a first gate electrode overlaps the boundary between the first IGFET active region and the field region in the first IGFET than second regions in which a second gate electrode overlaps a boundary between a second IGFET active region and the field region in a second IGFET connected between the first IGFET and the logic output node in at least one of the plurality of logic circuits.

11. The semiconductor device according to claim 8, wherein:

the counter measure is providing a first IGFET gate electrode having a longer first IGFET gate length in a region in which the first gate electrode overlaps the boundary between the first IGFET active region and the field region than in a central region of the first IGFET.

12. The semiconductor device according to claim 8, wherein:

the counter measure is providing a first IGFET gate electrode having a ring shaped pattern.

13. The semiconductor device according to claim 8, wherein:

the counter measure is a first threshold voltage of the first IGFET that is higher than a second threshold voltage of a second IGFET connected between the first IGFET and the logic output node in at least one of the plurality of logic circuits.

* * * * *